United States Patent
Jung et al.

(10) Patent No.: US 7,825,478 B2
(45) Date of Patent: Nov. 2, 2010

(54) POLARITY DEPENDENT SWITCH FOR RESISTIVE SENSE MEMORY

(75) Inventors: Chulmin Jung, Eden Prairie, MN (US); Maroun Georges Khoury, Burnsville, MN (US); Yong Lu, Edina, MN (US); Young Pil Kim, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 12/407,823

(22) Filed: Mar. 20, 2009

(65) Prior Publication Data

US 2010/0117160 A1    May 13, 2010

Related U.S. Application Data

(60) Provisional application No. 61/112,275, filed on Nov. 7, 2008.

(51) Int. Cl.
*H01L 29/00* (2006.01)
*H01L 21/425* (2006.01)

(52) U.S. Cl. ............ 257/379; 257/213; 257/298; 257/536; 257/E21.473; 257/E29.001; 438/514; 365/148; 365/185.05

(58) Field of Classification Search ............ 257/163, 257/213, 536, 379, 298, 156, 297, 164, E21.346, 257/E21.389, E21.703, E27.079, E27.112, 257/E29.211; 438/133, 135–140; 365/148, 365/189.07, 189.16, 185.05
See application file for complete search history.

(56) References Cited

U.S. PATENT DOCUMENTS

| | | | |
|---|---|---|---|
| 5,580,804 A | 12/1996 | Joh | |
| 6,114,211 A | 9/2000 | Fulford | |
| 6,300,205 B1 | 10/2001 | Fulford | |
| 7,009,877 B1 | 3/2006 | Huai | |
| 7,098,494 B2 | 8/2006 | Pakala | |
| 7,187,577 B1 | 3/2007 | Wang | |
| 7,224,601 B2 | 5/2007 | Panchula | |
| 7,272,034 B1 | 9/2007 | Chen | |
| 7,272,035 B1 | 9/2007 | Chen | |
| 7,282,755 B2 | 10/2007 | Pakala | |
| 7,286,395 B2 | 10/2007 | Chen | |
| 7,289,356 B2 | 10/2007 | Diao | |
| 7,345,912 B2 | 3/2008 | Luo | |
| 7,379,327 B2 | 5/2008 | Chen | |

(Continued)

OTHER PUBLICATIONS

Wang et al., Precision Control of Halo Implantation for Scaling-down ULSI Manufacturing, IEEE International Symposium on Sep. 13-15, 2005, pp. 204-207.
Hwang et al., Degradation of MOSFET's Drive Current Due to Halo Ion Implantation, Electron Devices Meeting, 1996, International Date: Dec. 8-11, 1996, pp. 567-570.

*Primary Examiner*—Victor A Mandala
*Assistant Examiner*—Whitney Moore
(74) *Attorney, Agent, or Firm*—Campbell Nelson Whipps LLC

(57) ABSTRACT

Polarity dependent switches for resistive sense memory are described. A memory unit includes a resistive sense memory cell configured to switch between a high resistance state and a low resistance state upon passing a current through the resistive sense memory cell and a semiconductor transistor in electrical connection with the resistive sense memory cell. The semiconductor transistor includes a gate element formed on a substrate. The semiconductor transistor includes a source contact and a bit contact. The gate element electrically connects the source contact and the bit contact. The resistive sense memory cell electrically connects to the bit contact. The source contact and the bit contact are asymmetrically implanted with dopant material.

16 Claims, 6 Drawing Sheets

U.S. PATENT DOCUMENTS

| | | |
|---|---|---|
| 7,382,024 B2 | 6/2008 | Ito |
| 7,502,249 B1 | 3/2009 | Ding |
| 7,515,457 B2 | 4/2009 | Chen |
| 2008/0170432 A1* | 7/2008 | Asao .......................... 365/171 |
| 2008/0273380 A1 | 11/2008 | Diao |
| 2008/0310213 A1 | 12/2008 | Chen |
| 2008/0310219 A1 | 12/2008 | Chen |
| 2009/0040855 A1 | 2/2009 | Luo |
| 2009/0162979 A1* | 6/2009 | Yang et al. .................. 438/136 |
| 2009/0185410 A1 | 7/2009 | Huai |

* cited by examiner

POLARITY DEPENDENT SWITCH FOR RESISTIVE SENSE MEMORY

RELATED APPLICATIONS

This application claims priority to U.S. provisional patent application No. 61/112,275, filed on Nov. 7, 2008 and titled "Polarity Dependent MOS Switch for Spin-Torque RAM". The entire disclosure of application No. 61/112,275 is incorporated herein by reference.

BACKGROUND

Fast growth of the pervasive computing and handheld/communication industry has generated exploding demand for high capacity nonvolatile solid-state data storage devices. Current technology like flash memory has several drawbacks such as slow access speed, limited endurance, and the integration difficulty. Flash memory (NAND or NOR) also faces significant scaling problems.

Resistive sense memories (RSM) are promising candidates for future nonvolatile and universal memory by storing data bits as either a high or low resistance state. One such memory, MRAM, features non-volatility, fast writing/reading speed, almost unlimited programming endurance and zero standby power. The basic component of MRAM is a magnetic tunneling junction (MTJ). MRAM switches the MTJ resistance by using a current induced magnetic field to switch the magnetization of MTJ. As the MTJ size shrinks, the switching magnetic field amplitude increases and the switching variation becomes more severe.

An MRAM write mechanism called Spin-Transfer Torque RAM (STRAM) uses a (bidirectional) current through the MTJ to realize the resistance switching. The switching mechanism of STRAM is constrained locally and STRAM is believed to have a better scaling property than the conventional MRAM.

However, a number of yield-limiting factors should be overcome before RSM enters the production stage. One concern in traditional RSM design is that the switching current through the RSM and transistor is asymmetric depending on the direction of the switching current. This asymmetric switching current can cause reduced reliability of the RSM.

BRIEF SUMMARY

The present disclosure relates to polarity dependent metal oxide semiconductor (MOS) switches or switching devices for resistive sense memory. In particular, the present disclosure relates to resistive sense memory unit that include a semiconductor transistor where source contact and the bit contact are asymmetrically implanted with dopant material.

In one particular embodiment, a memory unit includes a resistive sense memory cell configured to switch between a high resistance state and a low resistance state upon passing a current through the resistive sense memory cell and a semiconductor transistor in electrical connection with the resistive sense memory cell. The semiconductor transistor includes a gate element formed on a substrate. The semiconductor transistor includes a source contact and a bit contact. The gate element electrically connects the source contact and the bit contact. The resistive sense memory cell electrically connects to the bit contact. The source contact and the bit contact are asymmetrically implanted with dopant material.

An illustrative embodiment of a method of forming a memory unit includes implanting dopant material more heavily in a source contact than a bit contact of a semiconductor transistor and electrically connecting a resistive sense memory cell to the bit contact. The resistive sense memory cell is configured to switch between a high resistance state and a low resistance state upon passing a current through the resistive sense memory cell.

A further embodiment includes a select device having a semiconductor transistor with a gate element formed on a substrate. The semiconductor transistor includes a source contact and a bit contact, the gate element electrically connecting the source contact and the bit contact, the source contact and the bit contact being asymmetrically implanted with dopant material.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
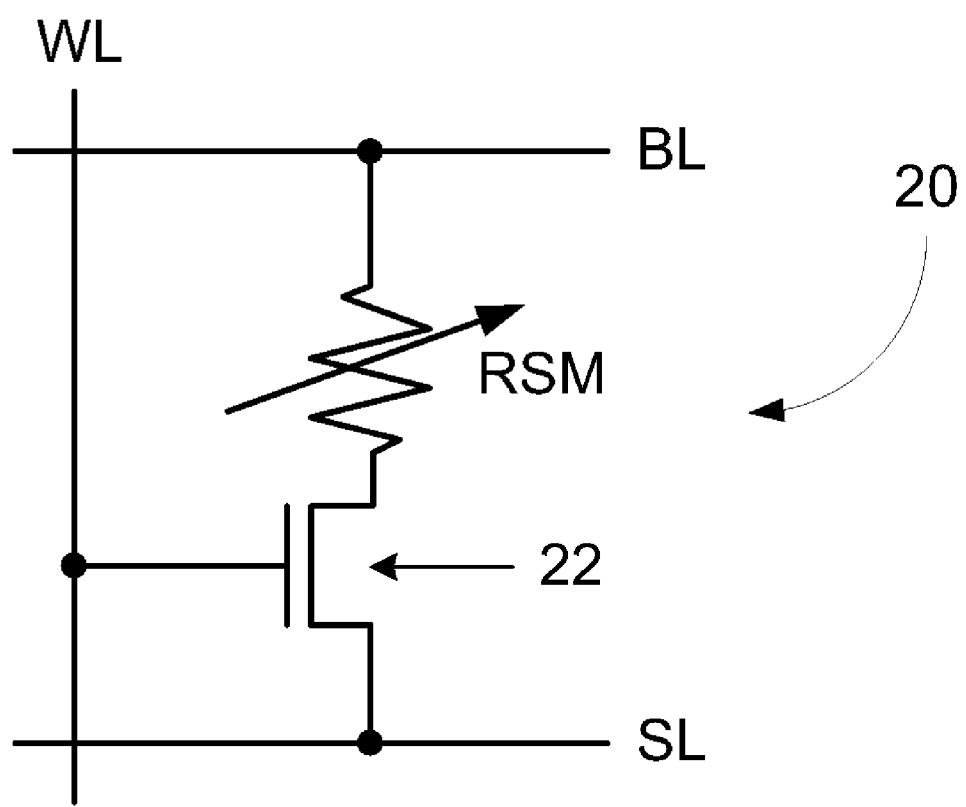
FIG. 1 is a schematic circuit diagram of an illustrative resistive sense memory unit.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to polarity dependent MOS switches for resistive sense memory. In particular, the present disclosure relates to resistive sense memory unit that include a semiconductor transistor where source contact and the bit contact are asymmetrically implanted with dopant material. By making the implantation differently between the source contact and bit contact the size of the semiconductor transistor can be reduced. In addition, by making the implantation different between the source contact and bit contact the breakdown voltage and the directional write current can be improved. During a read operation, leakage can be suppressed with the disclosed memory unit. This reduced leakage allows for growing larger arrays due to the larger signal to noise ratio. While the present disclosure is not so limited, an appreciation of various aspects of the disclosure will be gained through a discussion of the examples provided below.

The memory units disclosed herein include resistive sense memory cells. These resistive sense memory cells are configured to switch between a high resistance state and a low resistance state upon passing a current through the resistive sense memory cell. Exemplary resistive sense memory cells include spin-torque transfer memory cells and programmable metallization cells, for example. While spin-torque transfer memory cells are described below this disclosure is not limited to spin-torque transfer memory cells as resistive sense memory cells.

FIG. 1 is a schematic circuit diagram of an illustrative resistive sense memory unit 20. The resistive sense memory unit 20 includes a resistive sense memory cell RSM configured to switch between a high resistance state and a low resistance state upon passing a current through the resistive sense memory cell RSM. A semiconductor transistor 22 is serial electrical connection with the resistive sense memory cell RSM. The semiconductor transistor 22 is electrically coupled to a word line WL. A source line SL is electrically coupled to the semiconductor transistor 22. A bit line BL is electrically coupled to the resistive sense memory cell RSM.

At a normal operating voltage range, the current difference depending on current direction is due to the semiconductor transistor 22 operation principle. For example, when the bit line is set to VDD and the source line is set to 0V, the current flows from VDD to the drain of semiconductor transistor 22, which could write the low resistance state of the resistive sense memory cell RSM. When the source line is set to VDD and the bit line is set to 0V, the current flows from the source of the semiconductor transistor 22 to ground, which could write the high resistance state of the resistive sense memory cell RSM.

When the resistive sense memory cell RSM is attached at drain side of the semiconductor transistor 22, the current drivability is better because the voltage between the gate and source (Vgs) is VDD. This is good for driving but there is also possibility of breakdown of the resistive sense memory cell RSM itself because a large current means a large voltage drop across the resistive sense memory cell RSM. When the resistive sense memory cell RSM is attached between the source of the semiconductor transistor 22 and ground, the Vgs is not full VDD which reduces the driving current of semiconductor transistor 22. The resistive sense memory cell RSM requires the same current to make its status change. It is apparent that a higher gate voltage is required to make the same current flow from the source of the semiconductor transistor 22 to ground (e.g., bad direction) which degrades the reliability of the semiconductor transistor 22 and requires a delicate charge pump circuit and cannot have the random write ability across the wordline since the bitline needs to have the same polarity.

This disclosure describes the use of a polarity dependent semiconductor transistor 22 as a switch element for a resistive sense memory cell RSM. This is accomplished by providing a semiconductor transistor that is asymmetrically implanted with dopant material. In particular, the source side of the semiconductor transistor is implanted more heavily than the drain side of the semiconductor transistor. In other words, the source side of the semiconductor transistor is implanted with more dopant material than the drain side of the semiconductor transistor. As used herein, the drain side or region of the semiconductor transistor is electrically closer to the bit line and/or resistive sense memory cell than the source side or region. In many embodiments, the source side or region or contact is halo implanted with a dopant material such as boron or phosphorus, or arsenic or indium, for example and the drain side, region or contact is not halo implanted with a dopant material. A halo implant is an ion implant that is preformed at a high angle such as a tilt angle ranging from 20 to 60 degrees from horizontal or vertical. The halo implant, together with the well implant, sets the threshold voltage of the transistor. The halo implant can prevent punch through.

When current flows in the bad direction the current increases due to the leaky side being at source side. When current flows in the good direction, the halo implanted side is used as the source side of the semiconductor transistor which reduces the current due to a higher threshold voltage occurs at the source side of the halo implantation. The halo implantation tends to make the energy band higher so in order to make current flow, the gate to source voltage must be larger than the peak of a band diagram. The reverse case can happen when it comes to bad direction so a smaller Vgs is required to overcome the peak of the energy band.

Figure 2:
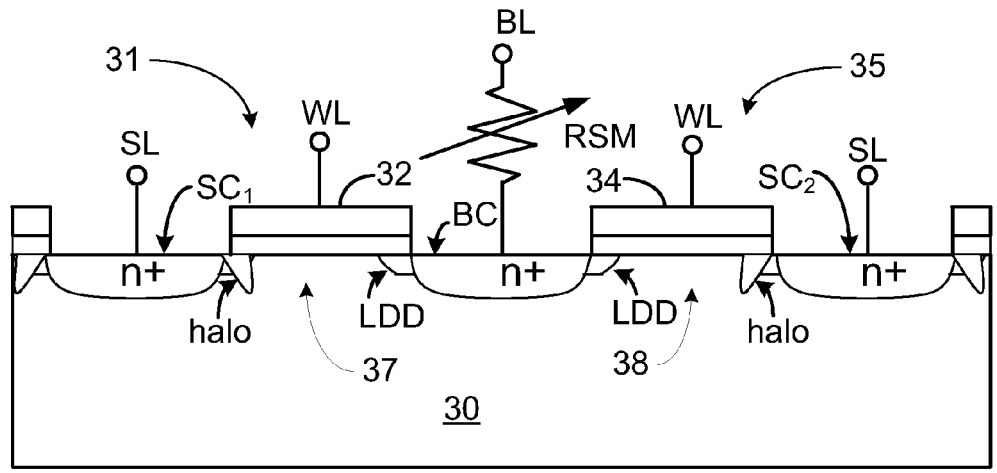
FIG. 2 is a side view schematic diagram of an illustrative memory unit.
Figure 3:
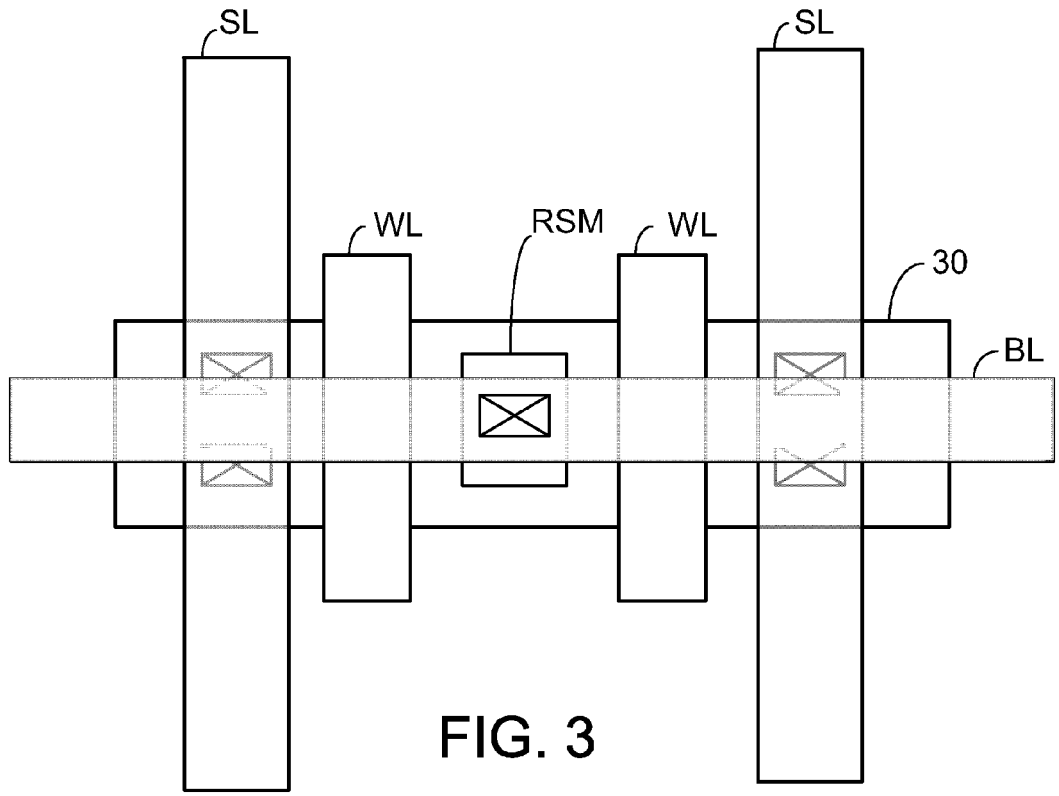
FIG. 3 is a top view schematic diagram of the illustrative memory unit shown in FIG. 2.
Figure 4:
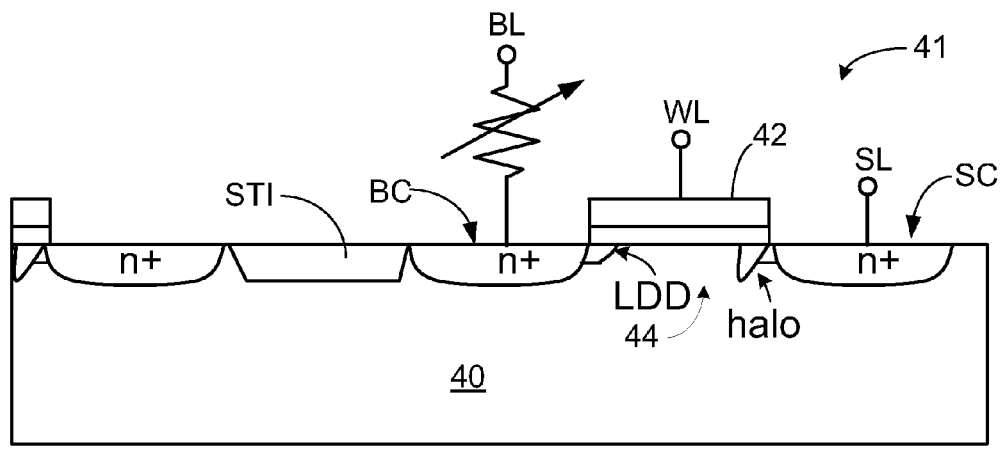
FIG. 4 is a side view schematic diagram of another illustrative memory unit.
Figure 5:
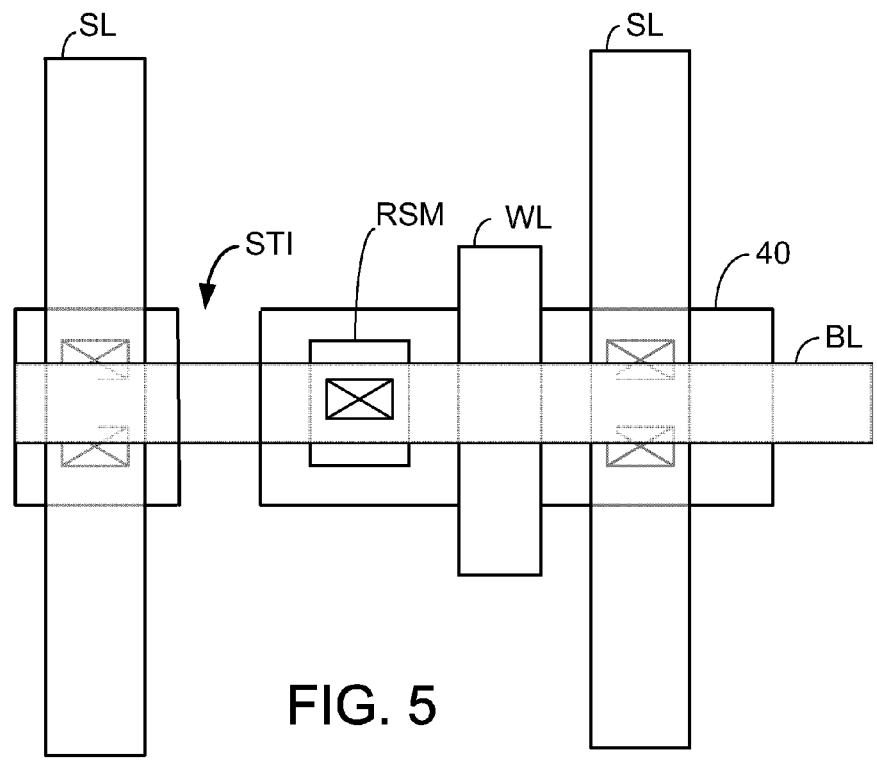
FIG. 5 is a top view schematic diagram of the illustrative memory unit shown in FIG. 4.

FIG. 2 is a side view schematic diagram of an illustrative memory unit and FIG. 3 is a top view schematic diagram of the illustrative memory unit shown in FIG. 2. This illustrative memory unit can be referred to as a "two finger" memory unit since there are two transistors for each memory cell. Each semiconductor transistor has two fingers to increase the layout efficiency by sharing bit lines with the other semiconductor transistors without using isolation area (as shown in FIG. 4 and FIG. 5).

The memory unit includes a resistive sense memory cell RSM configured to switch between a high resistance state and a low resistance state upon passing a current through the resistive sense memory cell. The memory unit is formed on a semiconductor substrate 30. In the illustrated embodiment the semiconductor substrate 30 is a p type material and the contact regions are n type regions, however the disclosure is not limited to this particular configuration, for example, the semiconductor substrate 30 can be a n type material and the contact regions can be p type regions, as desired A first semiconductor transistor or switching device 31 is in electrical connection with the resistive sense memory cell RSM via a common bit contact BC. The resistive sense memory cell RSM is electrically connected to a bit line BL. The first semiconductor transistor 31 includes a first gate element 32 formed on a semiconductor substrate 30. The first semiconductor transistor 31 includes a first source contact $SC_1$ and the common bit contact BC. A first channel region 37 extends between the first source contact $SC_1$ and the common bit contact BC and the first gate element 32 spans the first channel region 37. The first gate element 32 electrically connects the first source contact $SC_1$ and the common bit contact BC. The resistive sense memory cell RSM is electrically connected to the common bit contact BC. The first source contact $SC_1$ and the common bit contact BC are asymmetrically implanted with dopant material as described above.

A second semiconductor transistor or switching device 35 is in electrical connection with the resistive sense memory cell RSM. The second semiconductor transistor 35 includes a second gate element 34 formed on a semiconductor substrate 30. The second semiconductor transistor 35 includes a second source contact $SC_2$ and the common bit contact BC. A second channel region 38 extends between the second source contact $SC_2$ and the common bit contact BC and the second gate element 34 spans the second channel region 38. The second gate element 34 is electrically connected to the second source contact $SC_2$ and the common bit contact BC. The resistive sense memory cell RSM is electrically connected to the common bit contact BC. The second source contact $SC_2$ and the common bit contact BC are asymmetrically implanted with dopant material, as described above.

The semiconductor transistors 31 and 35 are asymmetrically implanted with dopant material. In particular, the source contact regions $SC_1$ and $SC_2$ of the semiconductor transistors 31 and 35 are implanted more heavily than the common bit contact BC the semiconductor transistors 31 and 35. In other words, the source side of the semiconductor transistor is implanted with more dopant material than the drain side of the semiconductor transistor. In the illustrated embodiment, the source contact regions $SC_1$ and $SC_2$ are halo implanted with a dopant material such as boron or phosphorous, or arsenic, or indium, for example, and the common bit contact BC is not halo implanted with a dopant material. In many embodiments, the source contact regions $SC_1$ and $SC_2$ are electrically connected to a common source line SL. In many embodiments, the first gate element 32 and the second gate element 34 are electrically connected to a common word line WL.

The first gate element 32 and the second gate element 34 are adjacent to and can overlap first implant regions of the common bit contact BC. These first implant regions are shown as lightly doped drain (LDD) regions in FIG. 4. These lightly doped drain (LDD) regions absorb some potential energy and reduce the maximum electric field. In many embodiments, the source contact regions $SC_1$ and $SC_2$ of the semiconductor transistors 31 and 35 are also implanted as lightly doped drain (LDD) regions in addition to the halo implants.

FIG. 4 is a side view schematic diagram of another illustrative memory unit. FIG. 5 is a top view schematic diagram of the illustrative memory unit shown in FIG. 4. This illustrative memory unit can be referred to as a "one finger" memory unit since only one select transistor is utilized for each memory cell. The memory unit includes a resistive sense memory cell RSM configured to switch between a high resistance state and a low resistance state upon passing a current through the resistive sense memory cell. The memory unit is formed on a semiconductor substrate 40. In the illustrated embodiment the semiconductor substrate 40 is a p type material and the contact regions are n type regions, however the disclosure is not limited to this particular configuration, for example, the semiconductor substrate 40 can be a n type material and the contact regions can be p type regions, as desired. An isolation region STI is located in the semiconductor substrate 40 to electrically separate adjacent memory units.

A semiconductor transistor 41 is in electrical connection with the resistive sense memory cell RSM via a bit contact BC. The resistive sense memory cell RSM is electrically connected to a bit line BL. The semiconductor transistor 41 includes a gate element 42 formed on a semiconductor substrate 40. The semiconductor transistor 41 includes a source contact SC and the bit contact BC. A channel region 44 extends between the source contact SC and the bit contact BC and the gate element 42 spans the channel region 44. The gate element 42 electrically connects the source contact SC and the bit contact BC. The resistive sense memory cell RSM is electrically connected to the bit contact BC.

The semiconductor transistor 41 source contact SC and the bit contact BC are asymmetrically implanted with dopant material. In particular, the source contact region SC of the semiconductor transistors 41 are implanted more heavily than the bit contact BC the semiconductor transistor 41. In the illustrated embodiment, the source contact region SC is halo implanted with a dopant material such as boron or arsenic or phosphorous, or indium, for example, and the bit contact BC is not halo implanted with a dopant material.

The gate element 42 is adjacent to and can overlap the implant region of the bit contact BC and the source contact SC. The bit contact BC implant region is shown as a lightly doped drain (LDD) region in FIG. 6. The lightly doped drain (LDD) region absorbs some potential energy and reduces the maximum electric field. In many embodiments, the source contact region SC of the semiconductor transistor 41 is also implanted as lightly doped drain (LDD) regions in addition to the halo implants. In many embodiments, the source contact region SC is electrically connected to a source line SL. In many embodiments, the gate element 42 is electrically connected to a word line WL.

Figure 6A:
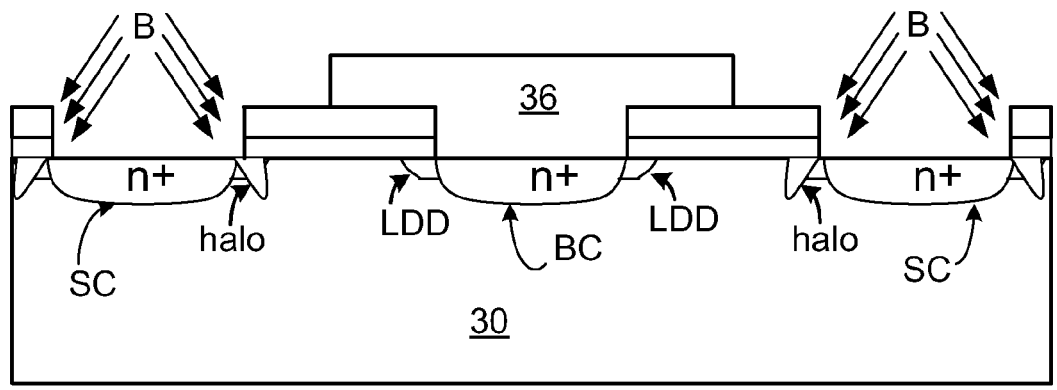
FIG. 6A-6B are side view schematic diagrams forming an illustrative memory unit.
Figure 6B:
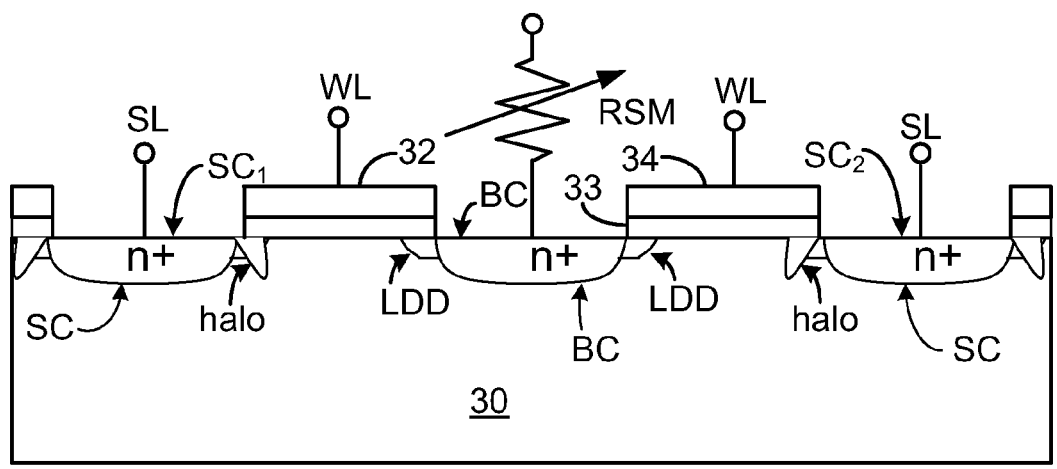
Figure 7:
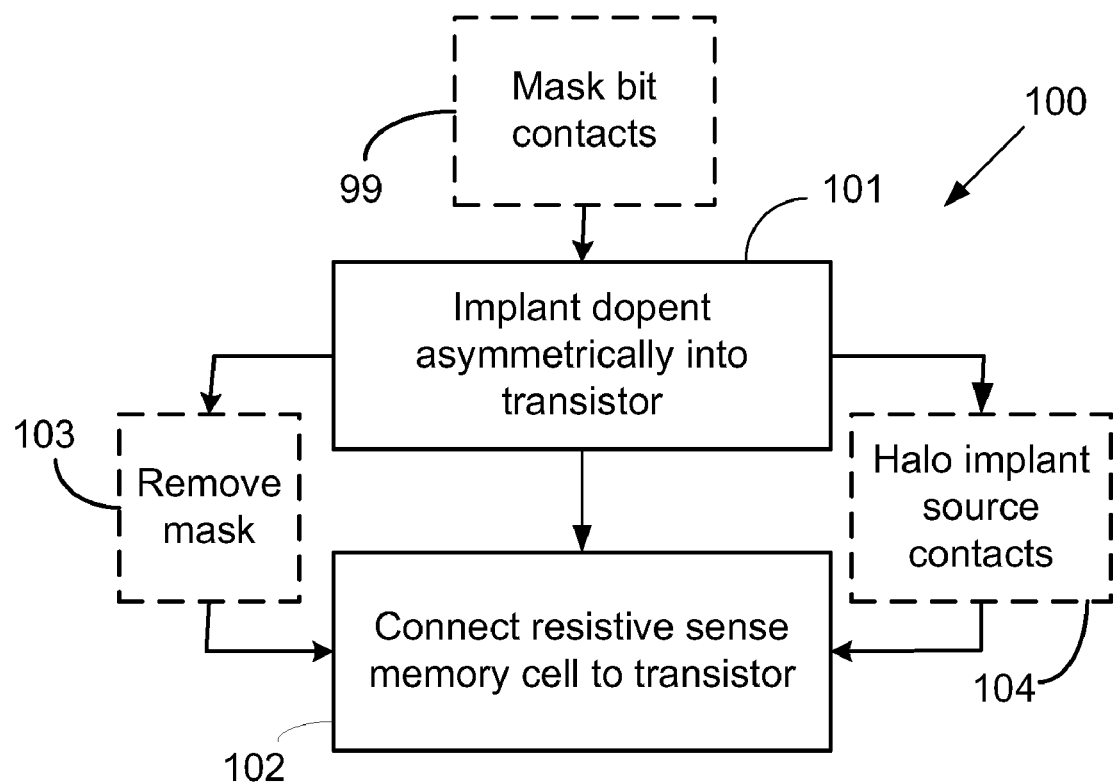
FIG. 7 is a flow diagram for forming an illustrative memory unit.

FIG. 6A-6B are side view schematic diagrams forming an illustrative memory unit and FIG. 7 is a flow diagram 100 for forming an illustrative memory unit. The method includes implanting dopant material B more heavily in a source contact region SC than a bit contact BC of a semiconductor transistor at FIG. 6A and at block 100 of FIG. 7. In some embodiments the halo implanted dopant material B is implanted at an angle into the semiconductor substrate 30 forming the halo implants halo at block 104. A photoresist material 36 can optionally be utilized to mask the bit contact BC of a semiconductor transistor, preventing halo dopant material B from being implanted into the bit contact BC of a semiconductor transistor during the halo implantation step, at block 99. The bit contact region BC includes LDD regions, as described above. The photoresist material 36 can then be removed, if utilized, following the implantation of the halo dopant material, at block 103.

Then the method includes electrically connecting a resistive sense memory cell RSM to the bit contact BC at FIG. 6B and at block 102 of FIG. 7. The elements illustrated in FIG. 6B are described above in relation to FIG. 2. The resistive sense memory units described herein can be fabricated utilizing semiconductor fabrication techniques.

Figure 8:
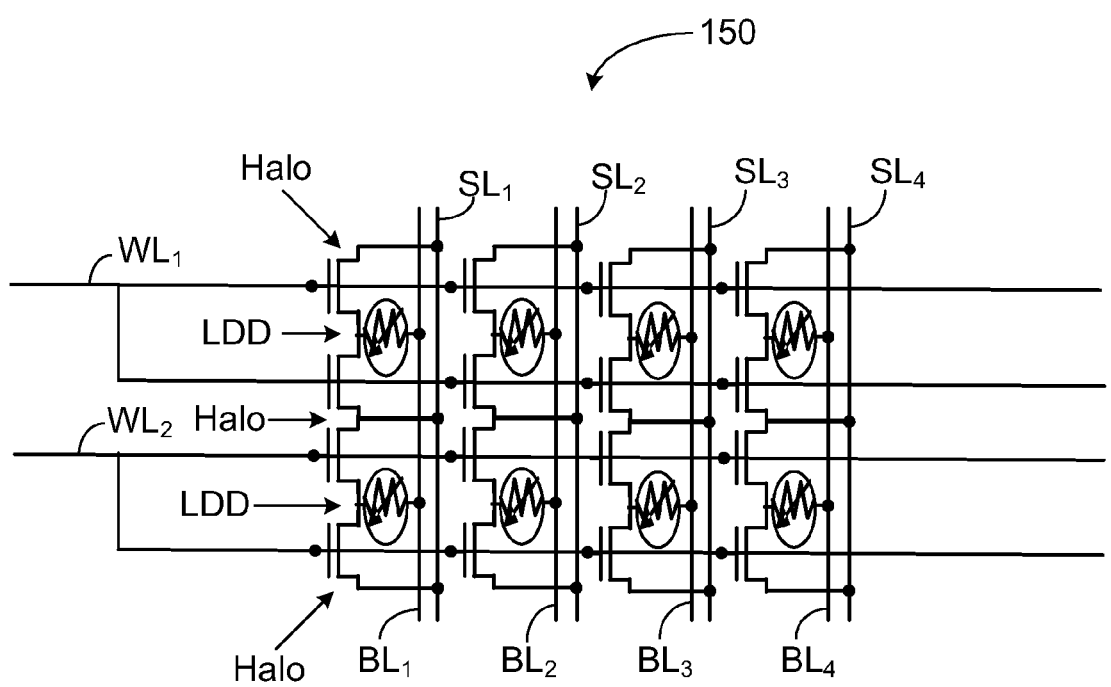
FIG. 8 is a schematic circuit diagram of an illustrative resistive sense memory array.

FIG. 8 is a schematic circuit diagram of an illustrative resistive sense memory array 150. The illustrated resistive sense memory array 150 includes eight resistive sense memory cells, however the resistive sense memory array can include any useful number of resistive sense memory cells. The resistive sense memory cells illustrated are referred to as "two finger" memory units as illustrated in FIG. 2 and FIG. 3 above. The illustrative resistive sense memory array 150 includes four source lines $SL_1$, $SL_2$, $SL_3$, $SL_4$; four bit lines $BL_1$, $BL_2$, $BL_3$, $BL_4$ and two word lines $WL_1$, $WL_2$ forming a cross-point array. The halo implants Halo are disposed in the semiconductor transistor between the gate and the source line SL, as described above. The LDD implants are disposed in the semiconductor transistor between the gate and the resistive sense memory cell, as described above.

The bit lines $BL_1$, $BL_2$, $BL_3$, $BL_4$ are connected to the resistive sense memory cells and the source lines $SL_1$, $SL_2$, $SL_3$, $SL_4$ are connected to the semiconductor transistors. Each semiconductor transistor has two fingers to increase the layout efficiency by sharing bit lines with the other semiconductor transistors without using isolation area (as shown in FIG. 4 and FIG. 5). During the bad write direction, the source line is driven by a write driver to VDD. The LDD (Lightly Doped Drain) implants are utilized as the source which lowers the threshold voltage of the semiconductor transistor therefore increasing the current relatively. During the good write direction, the source line is driven to 0 v and the bit line to VSS. The source side has the halo implantation which increases the threshold voltage of semiconductor transistor. The halo implant reduces the current and prevents the break down of the semiconductor transistor relatively. During the read operation, current leakage can be suppressed by using the halo side as the source side of the semiconductor transistor. The leakage reduction during the read provides an advantage for growing a larger array due to a larger Signal to Noise (S/N) ratio.

Thus, embodiments of the POLARITY DEPENDENT SWITCH FOR RESISTIVE SENSE MEMORY are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A memory unit, comprising:
   a resistive sense memory cell configured to switch between a high resistance state and a low resistance state upon passing a current through the resistive sense memory cell;
   a semiconductor transistor in electrical connection with the resistive sense memory cell, the semiconductor transistor comprising a gate element formed on a substrate, the semiconductor transistor comprises a source contact and a bit contact, the gate element electrically connecting the source contact and the bit contact, the resistive sense memory cell electrically connected to the bit contact, the source contact and the bit contact being asymmetrically implanted with dopant material, the source contact is halo implanted with a dopant material and the bit contact is not halo implanted with a dopant material.

2. A memory unit according to claim 1, wherein the amount of dopant material in the source contact is greater than the amount of dopant material in the bit contact.

3. A memory unit according to claim 1, wherein the dopant material is boron.

4. A memory unit according to claim 1, wherein the bit contact includes a lightly doped drain region.

5. A memory unit according to claim 1, wherein the resistive sense memory cell comprises a spin-torque transfer memory cell.

6. A memory unit according to claim 1, wherein a write current in an easy direction passes through the source contact before the bit contact, and a write current in a hard direction passes through the bit contact before the source contact.

7. A memory unit according to claim 1, wherein the memory unit includes only a single semiconductor transistor in electrical connection with a single resistive sense memory cell.

8. A memory unit according to claim 1, wherein the memory unit further includes a second semiconductor transistor in electrical connection with the resistive sense memory cell.

9. A memory unit, comprising:
   a resistive sense memory cell configured to switch between a high resistance state and a low resistance state upon passing a current through the resistive sense memory cell;
   a first switching device in electrical connection with the resistive sense memory cell, the first switching device comprising a first gate element formed on a substrate, the first switching device comprises a first source contact and a common bit contact, the first gate element electrically connecting the first source contact and the common bit contact, the resistive sense memory cell electrically connected to the common bit contact, the first source contact and the common bit contact being asymmetrically implanted with dopant material; and
   a second switching device in electrical connection with the resistive sense memory cell, the second switching device comprising a second gate element formed on the substrate, the second switching device comprises a second source contact and the common bit contact, the second gate element electrically connecting the second source contact and the common bit contact, the resistive sense memory cell electrically connected to the common bit contact, the second source contact and the common bit contact being asymmetrically implanted with dopant material;
   wherein the first source contact and the second source contact are more heavily implanted with dopant material than the common bit contact.

10. A memory unit according to claim 9, wherein the first source contact and second source contact is halo implanted with a dopant material.

11. A memory unit according to claim 10, wherein the common bit contact includes a lightly doped drain region.

12. A memory unit according to claim 11, wherein the common bit contact is not halo implanted with a dopant material.

13. A memory unit according to claim 9, wherein the resistive sense memory cell comprises a spin-torque transfer memory cell.

14. A memory unit according to claim 9, wherein the first source contact and the second source contact are electrically connected to a common source line.

15. A memory unit according to claim 9, wherein the first gate contact and second gate contact are electrically connected to a common word line.

16. A select device comprising;
   a semiconductor transistor comprising a gate element formed on a substrate, the semiconductor transistor comprises a source contact and a bit contact, the gate element electrically connecting the source contact and the bit contact, the source contact and the bit contact being asymmetrically implanted with dopant material, the source contact is halo implanted with a dopant material and the bit contact is not halo implanted with a dopant material.

* * * * *